(12) United States Patent
Anderson

(10) Patent No.: US 6,574,100 B1
(45) Date of Patent: Jun. 3, 2003

(54) THIN SERVER WITH SIDE VENT HOLES AND SPACER RAIL

(75) Inventor: Paul H. Anderson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,221

(22) Filed: Jun. 30, 2000

(51) Int. Cl.$^7$ .............................. G06F 1/20; H05K 7/20; A47B 77/00
(52) U.S. Cl. ........................ 361/687; 361/692; 361/695; 361/727; 312/236; 312/223.2; 165/80.3; 454/184
(58) Field of Search ................................ 361/687–695, 361/724–727; 312/236, 223.2; 165/80.3; 454/184

(56) References Cited

U.S. PATENT DOCUMENTS

| | | | | |
|---|---|---|---|---|
| 5,505,533 A | * | 4/1996 | Kammersqard et al. | 312/236 |
| 5,600,538 A | * | 2/1997 | Xanthopoulos | 361/683 |
| 5,871,264 A | * | 2/1999 | Ohara | 312/223.2 |
| 5,978,217 A | * | 11/1999 | Kerrigan et al. | 361/694 |
| 6,011,701 A | * | 1/2000 | Kopp et al. | 454/184 |
| 6,069,792 A | * | 5/2000 | Nelik | 361/687 |
| 6,141,213 A | * | 10/2000 | Antonuccio et al. | 361/687 |
| 6,185,098 B1 | * | 2/2001 | Benavides | 361/695 |
| 6,227,632 B1 | * | 5/2001 | Liu | 312/223.2 |
| 6,317,318 B1 | * | 11/2001 | Kim | 361/685 |
| 6,333,849 B1 | * | 12/2001 | Donahoe et al. | 361/687 |

* cited by examiner

*Primary Examiner*—Darren Schuberg
*Assistant Examiner*—Lisa Lea-Edmonds
(74) *Attorney, Agent, or Firm*—Antonelli, Terry, Stout & Kraus, LLP

(57) ABSTRACT

Disclosed is apparatus, and a method, for providing increased cooling air flow for a computer, particularly a thin server mounted in an enclosure (e.g., a cabinet). The thin server has holes in one side thereof, in addition to holes in the front and back, for increased vent openings for air flow, especially for exit of warmed air. The apparatus includes a spacer rail along the one side of the thin server having the holes, the spacer rail exposing the holes. In mounting the thin server in a cabinet, the spacer rail, and the side of the thin server opposite the side having the holes, are fastened to (supported by) the sides of the cabinet, to mount the thin server in the cabinet.

30 Claims, 7 Drawing Sheets

THIN SERVER WITH SIDE VENT HOLES AND SPACER RAIL

BACKGROUND

The present invention is directed to apparatus, and a method, for increased cooling of computers (e.g., thin servers), particularly for increased cooling of computers mounted on a support such as on a rack or in a cabinet. The present invention is especially directed to apparatus, and a method, for increased cooling of thin servers, mounted on the support (illustratively, on a rack or in a cabinet), especially where a plurality of thin servers as positioned one above another in a secure enclosure (such as a cabinet having a locked security door).

The present trend of providing more processing power, contained in steadily smaller server designs, is creating large hurdles for thermal cooling solutions. The problem of providing sufficient cooling is exacerbated when a plurality of the thin servers are provided in a cabinet and are locked therein through use of, e.g., a security door which may be locked shut to prevent removal of the servers but which may be opened to permit removal of the servers. Illustratively, the cabinet can include, for example, up to 42 thin servers positioned vertically one above the other in the cabinet. However, use of such plurality of thin servers (for example, each having a height of 2U or 1U, where U=1.75 inches) increases the amount of cooling necessary; yet, with the thin servers within an enclosure such as a cabinet, and with outlets for warm air from the rear of the thin server being limited due to design configuration limiting the available area for air vents (openings) in the rear of each thin server, there is a restriction on the ability to provide cooling by air flow.

Illustratively, the front of the 1U server should support at least 15% hole area, for ambient inlet air, whereas the rear of the server should equal or exceed this quantity for warmed outlet air. Typically, the rear holes cannot equal or approximate the percentage of front area holes, due to system constraints. This causes an imbalance of ambient inlet air to warmed outlet air, and this imbalance causes excessive back pressure to build up within the system, thus preventing ability to achieve proper internal component cooling.

Various types of cabinets, in which, for example, thin servers can be mounted, have standard dimensions, including internal width dimensions, as set forth in EIA Standard EIA-310-D, September 1992, of the Electronic Industries Association (American National Standard ANSI/EIA-310-D-1992, approved Aug. 24, 1992). This EIA Standard also defines a cabinet as a free standing and self-supporting enclosure for housing electrical and/or electronic equipment, usually fitted with doors and/or side panels, which may or may not be removable; and defines a rack as an open structure for mounting electrical or electronic equipment. This standard defines panels as flat, rectangular structural members used for the external surface of equipment, describing that panels are designed to be mounted on the mounting flanges of cabinets or racks, and that they are usually used for mounting controls, data presentation, apparatus or equipment. These definitions will be used throughout the present application.

While there are standard dimensions defined for widths of, e.g., cabinets, there are no standard dimensions set for widths of the computers (for example, thin servers) provided in such cabinets.

Conventionally, thin servers are mounted within a cabinet, or on a rack, using extension slides. The extension slides are mounted to the sides of the chassis of the computer, disallowing any opportunity for cooling through the sides of the chassis.

BRIEF DESCRIPTION OF THE DRAWINGS

The foregoing and a better understanding of the present invention will become apparent from the following detailed description of exemplary embodiments and claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and is not limited thereto. The spirit and scope of the present invention is limited only by the terms of the appended claims.

The following represents brief descriptions of the drawings, wherein.

DETAILED DESCRIPTION

Figure 1:
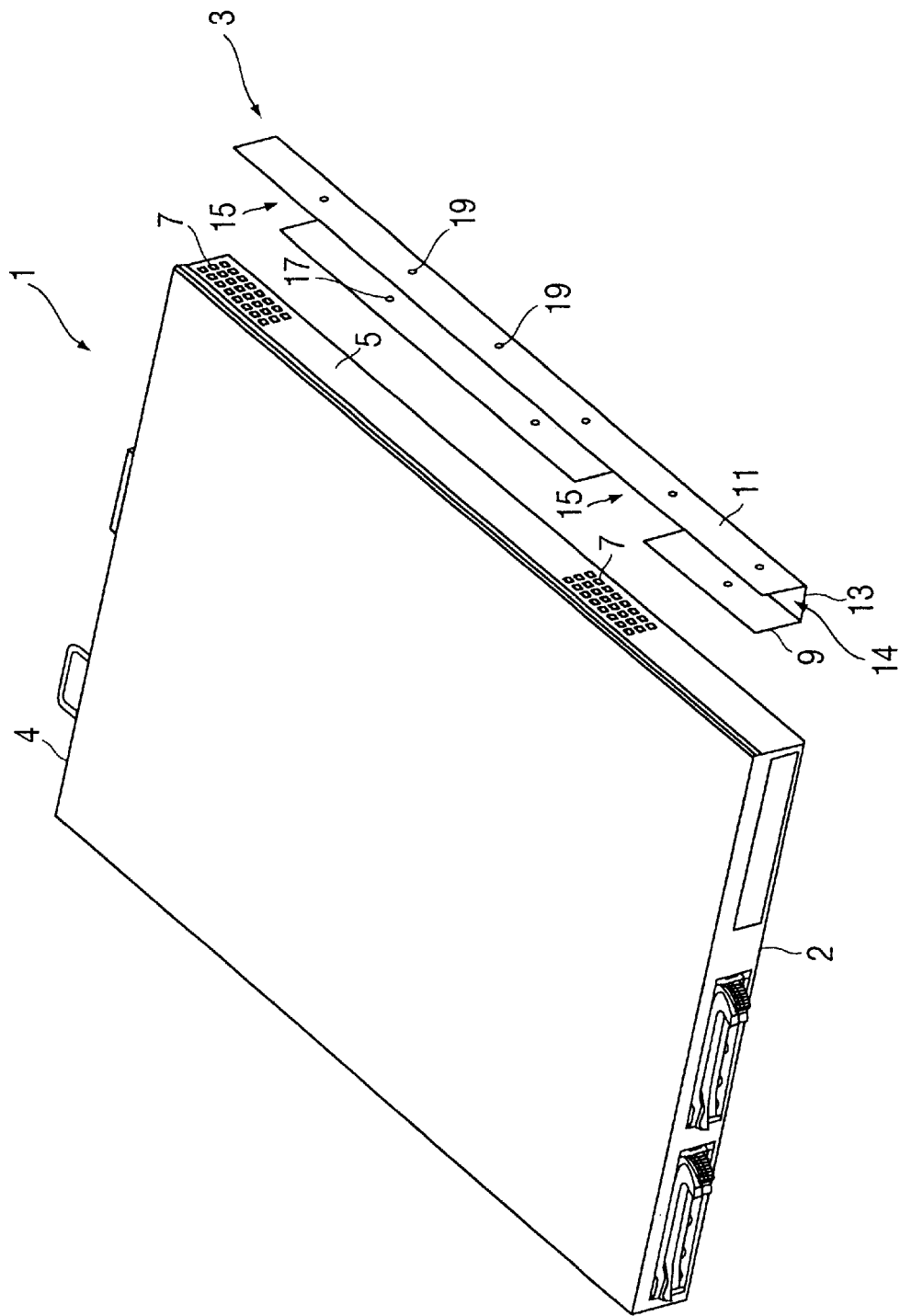
FIG. 1 is a perspective view showing a thin server, including the chassis of the thin server, with holes in one side of the chassis for circulation of air through the chassis, and a spacer rail, according to a first example embodiment.

In the following descriptions in connection with the drawing figures, the present invention will be described in connection with its application to a thin server, for example, a server having a height of 1U (1.75 inches) or 2U (3.50 inches). However, the present invention is not limited to use with such thin servers, and can be applied in connection with any computer, particularly a computer provided in a cabinet, to provide increased cooling. Moreover, the present invention is primarily described in connection with mounting the thin server in a cabinet, by using extension slides mounted to the sides of the cabinet. However, the present invention is not limited thereto, and can be applied to any computer mounted on a support (e.g., a rack) using any technique for fastening the computer to the support (e.g., via the spacer rail).

The present invention provides improved cooling particularly when mounting a plurality of thin servers on a support (for example, in a cabinet as defined previously). Applicant has found that by providing additional cooling vents (holes) through one side of the chassis, particularly the side closest to the baseboard core components of the server (for example, processor(s), memory, voltage regulation chips and other chips), and by attaching a spacer rail to this one side of the chassis having the additional cooling holes, the thin server can be mounted to, e.g., the sides of a support (for example, sides of an enclosure, such as a cabinet) while still providing adequate air flow through the computer and sufficient cooling. By use of the spacer rail, and with additional holes for air flow provided in the side of the server chassis, these additional holes can be spaced from the side (e.g., side panel) of the enclosure, thereby providing a space for air outflow through the side of the chassis, in addition to air outflow from the rear of the server, to thereby avoid an imbalance of ambient inlet air to removal of warmed outlet air. Moreover, the spacer rail can provide an air flow channel along the side of the thin server, to move air efficiently and effectively along the side of the thin server. In addition, by placement of the holes in the side of the thin server, holes in the side can also be used for inflow of ambient (cooler) air into the thin server.

The spacer rail includes apertures or cut-out portions to expose the additional cooling (air flow) holes through the one side of the chassis, thereby facilitating continual air flow from the chassis side (effectively controlling back pressure). In addition, through use of the spacer rail which, for example, extends a length of the side of the server, the spacer rail helps maintain structural integrity and robustness of the thin server, e.g., when mounted in a security enclosure such as a cabinet.

Through use of the holes in the side of the thin server chassis, the system designer is given more options to solve heating problems in the thin server. Additionally, through the addition of the spacer rail along the side of the server, in combination with the additional holes in the side of the server, the holes are easily exposed to achieve efficient chassis side venting, while providing reinforcement to the server-to-support mounting scheme.

Thus, through use of the spacer rail, which allows for apertures in the side of the thin server (for example, 1U server), the total area of outlet aperture for warmed air can equal or exceed the total area of inlet aperture for ambient air, so that back pressure within the server can be minimized, and proper internal cooling can be more readily addressed.

In addition, by providing the side apertures toward the rear of the server, rather than toward the front where ambient air enters the server, more effective use of the side holes for removing warmed outlet air from the server, rather than acting as an additional inlet for drawing ambient air into the server, can be achieved.

Referring to the figures in which like numerals indicate like elements, FIG. 1 is a perspective view of thin server 1 and spacer rail 3 according to an example embodiment. Shown in one side 5 of thin server 1 are holes 7 for circulating air through thin server 1 (e.g., through the chassis of thin server 1). Depending on placement of holes 7 and of an air moving device (e.g., a fan) in thin server 1, holes 7 can act as inlets for ambient air or as outlets for air warmed within the thin server (which, correspondingly, cools components in the thin server). Thin server 1 has front 2 and rear 4; as can be appreciated, ambient air will enter through front 2 of thin server 1 and will exit through rear 4 of thin server 1, in addition to air flow through holes 7 in one side 5 of thin server 1. Front 2 and rear 4, together with sides 5 and 37 (see FIG. 6), are elements of a chassis of thin server 1. Also shown in FIG. 1 is spacer rail 3; in practice, spacer rail 3 is fastened to side 5 of thin server 1 according to an example embodiment. For example, using fastening holes 17, spacer rail 3 can be fastened to one side 5 of thin server 1. While, e.g., holes 17 are shown in FIG. 1, which can be screw holes, the fastening need not be accomplished through use of screws; for example, spacer rail 3 can be mounted in slots in one side 5 of thin server 1. Spacer rail 3 can be removably fastened to side 5 of thin server 1, and, as discussed further infra, can be removably fastened to the side of a support.

Spacer rail 3 as shown in FIG. 1 has first and second leg portions, respectively to be attached to side 5 of thin server 1 and to the support (e.g., side of a cabinet) for thin server 1. Connecting first and second leg portions 9, 11, respectively, is connection member 13, which provides air channel 14 for air flow access to holes 7.

First leg portion 9 of spacer rail 3 has cut-out portions 15, 15, for exposing holes 7. While cut-out portions are shown, as can be appreciated first leg portion 9 can have apertures corresponding to holes 7, for exposing holes 7 to permit air circulation.

Also shown in FIG. 1 are holes 19 in second leg portion 11, to facilitate fastening second leg portion 9 to a support (discussed further infra).

The chassis of thin server 1 can be made of materials, and by procedures, used to presently manufacture chassis of thin servers, with the additional procedure of forming holes in side 5 of the chassis of thin server 1 (e.g., by a same technique, such as stamping, used to form holes in a rear panel of the chassis of thin server 1).

Preferably, spacer rail 3 is formed of a sheet metal, and can be formed by appropriate bending and cutting (or, e.g., stamping). Spacer rail 3 can also be made of a plastic; and, e.g., spacer rail 3 can be made by a molding process.

Figure 2:
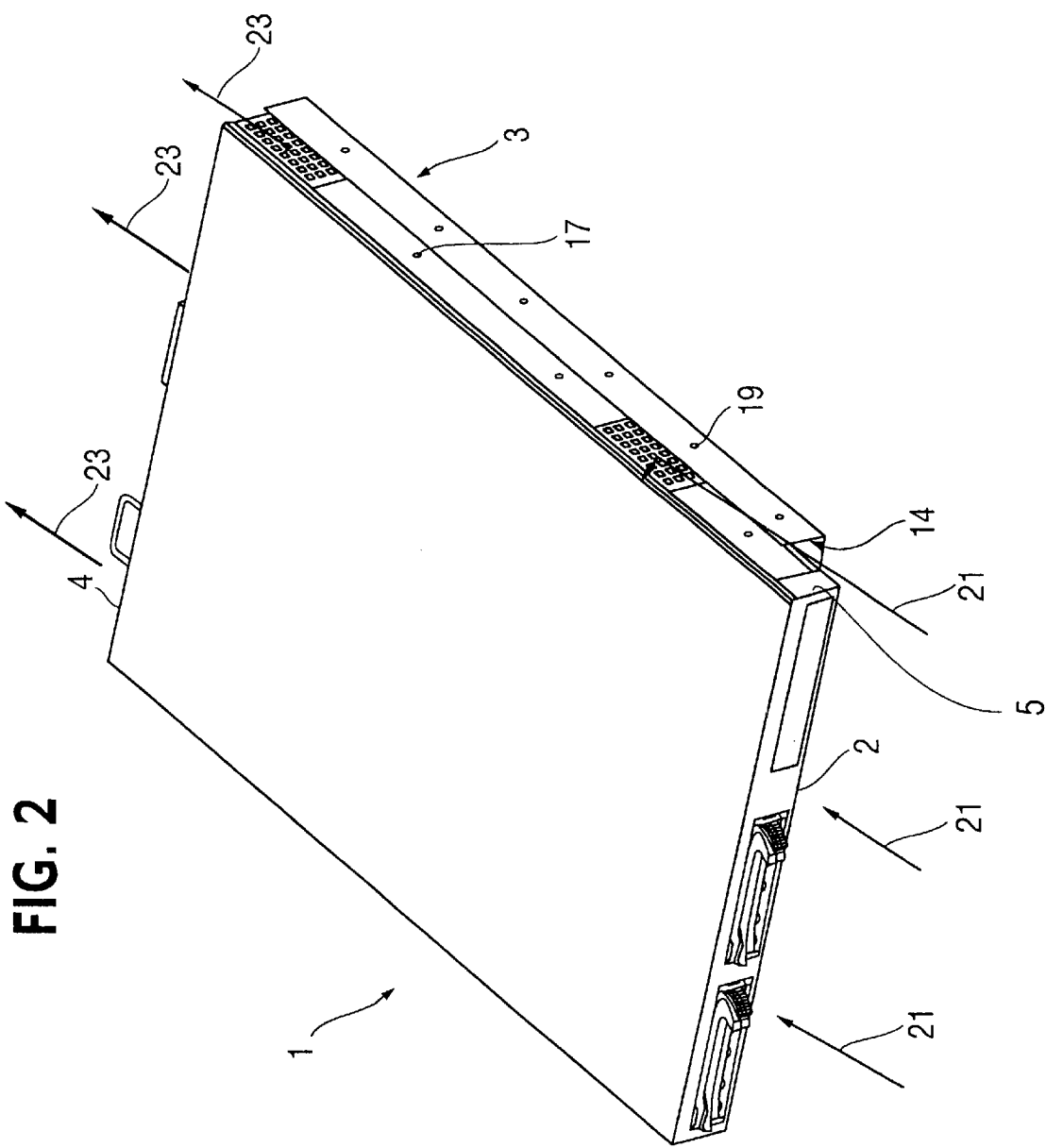
FIG. 2 is a perspective view of the thin server of this first example embodiment, having the spacer rail fastened to the chassis thereof.

FIG. 2 shows the example embodiment of FIG. 1, with spacer rail 3 fastened to side 5 of thin server 1. Also shown in FIG. 2 are air flow patterns in connection with the structure of this example embodiment. That is, as represented by arrows 21, ambient (cool) air enters front 2 of thin server 1 and also enters holes 7 in side 5 of thin server 1, closest to front 2. Warmed air, represented by arrows 23, exit from rear 4 of thin server 1, and from holes 7 in side 5 of thin server 1, which are closest to rear 4 of thin server 1.

As can be appreciated, by appropriate positioning of holes 7 in side 5 of thin server 1, an appropriate ratio of openings for cool air to enter thin server 1 for cooling, and warmed air to exit thin server 1, can be achieved. In this regard, for example, the area of openings 7 toward rear 4 of thin server 1 can be increased, while the area of openings 7 in side 5 closer to front 2 of thin server 1 can be decreased, so as to increase area of warmed air outlet to thereby avoid any excessive back pressure to build up within thin server 1, thus avoiding inadequate internal component cooling. That is, through appropriate forming of holes, and positions thereof, in side 5 of thin server 1, especially together with positioning of a fan within thin server 1 to force air flow through thin server 1, the total outlet opening area for outlet warmed air can equal or exceed total inlet area for ambient air, to thereby minimize back pressure within the thin server and provide better designed internal cooling.

Figure 4:
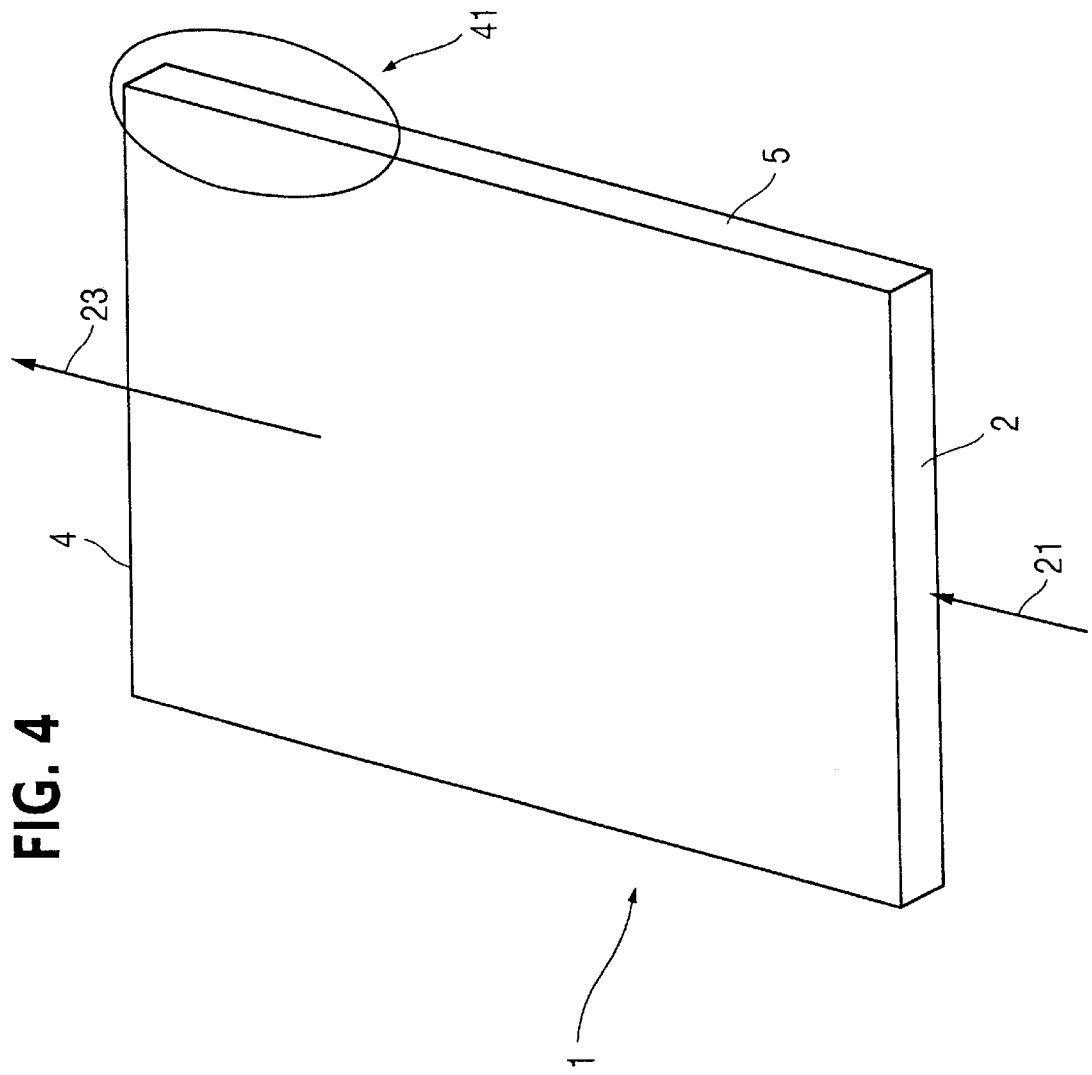
FIG. 4 is a schematic perspective view showing another example embodiment of a thin server.

FIG. 4 shows schematically, in perspective view, an example embodiment where all holes in side 5 are provided near rear 4 of thin server 1. That is, shown in FIG. 4 is side area 41 for outlet of warmed air. Cool, ambient air 21 enters only through front 2 of thin server 1. Warmed air having passed through thin server 1 (that is, passing internally through the chassis of thin server 1) exits as warmed air 23 through apertures in rear 4 of thin server 1 and via the holes in side area 41 of side 5 of thin server 1. Thus, outlet openings for warmed air can be increased, avoiding excessive back pressure as discussed previously.

Generally, front 2 of a thin server has at least 15% open area as inlet for ambient air for cooling; due to design considerations, the area of holes in front 2 is always greater than the area of holes in rear 4. Through utilizing increased outlet area in side 5, and, in particular, with at least 5% open area in side 5, the total of cooling area in side 5 and rear 4 can be made greater than holes for inlet ambient air in front 2, providing effective cooling. With holes in side cooling area 41 as shown in FIG. 4, e.g., with the holes in side 5 only in the back 25% of side 5, improved outlet area for warmed air is achieved.

Figure 3:
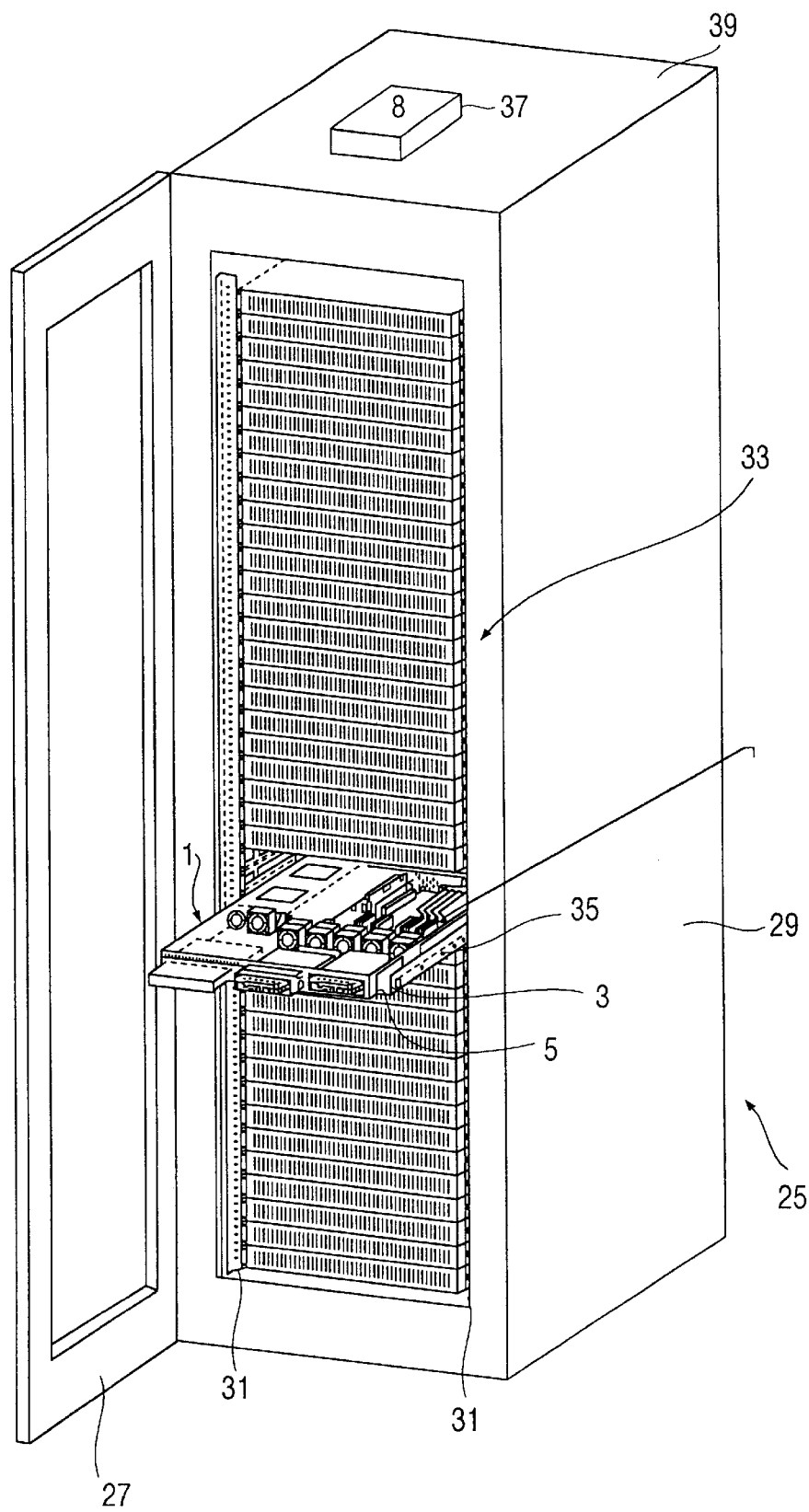
FIG. 3 is a perspective view showing a thin server having a spacer rail according to an example embodiment of the present invention, partially inserted in a cabinet.

FIG. 3 is a perspective view showing cabinet 25 having a plurality of servers one above the adjacent server, according to an example embodiment. Shown in FIG. 3 is cabinet 25, having front security door 27. Front security door 27 can, for example, be shut and locked, so that thin servers 1 cannot be removed from the cabinet. Shown in FIG. 3 are a plurality 33 of thin servers 1, each vertically above an adjacent server. Each server can, for example, be 1U (that is, 1.75 inches) in height. Of course, the present invention is not limited to being applied to servers having a height of 1U, but can be applied to other computers, including other servers, such as servers having a height of 2U (2U being 3.50 inches in height).

FIG. 3 shows thin server 1 mounted on side 29 and its opposed side (not shown in the perspective view in FIG. 3). That is, cabinet 25 includes supporting structure 31 on opposed sides of cabinet 25, for supporting computer 1.

Shown in FIG. 3 is one of the plurality 33 of thin servers, partially mounted into cabinet 25. As seen in FIG. 3, attachment 35 to spacer rail 3 is mounted on supporting structure 31, which is on the inside of the panel forming side 29; and a side of thin server 1 opposite side 5 thereof is mounted on supporting structure 31 on the side of cabinet 25 opposite to side 29.

Also shown in FIG. 3 is fan 37 on top 39 of cabinet 25. Fan 37 is used in a preferred example embodiment, in order to draw warmed air out of the interior of cabinet 25, facilitating cooling of the plurality 33 of thin servers 1.

Figure 5:
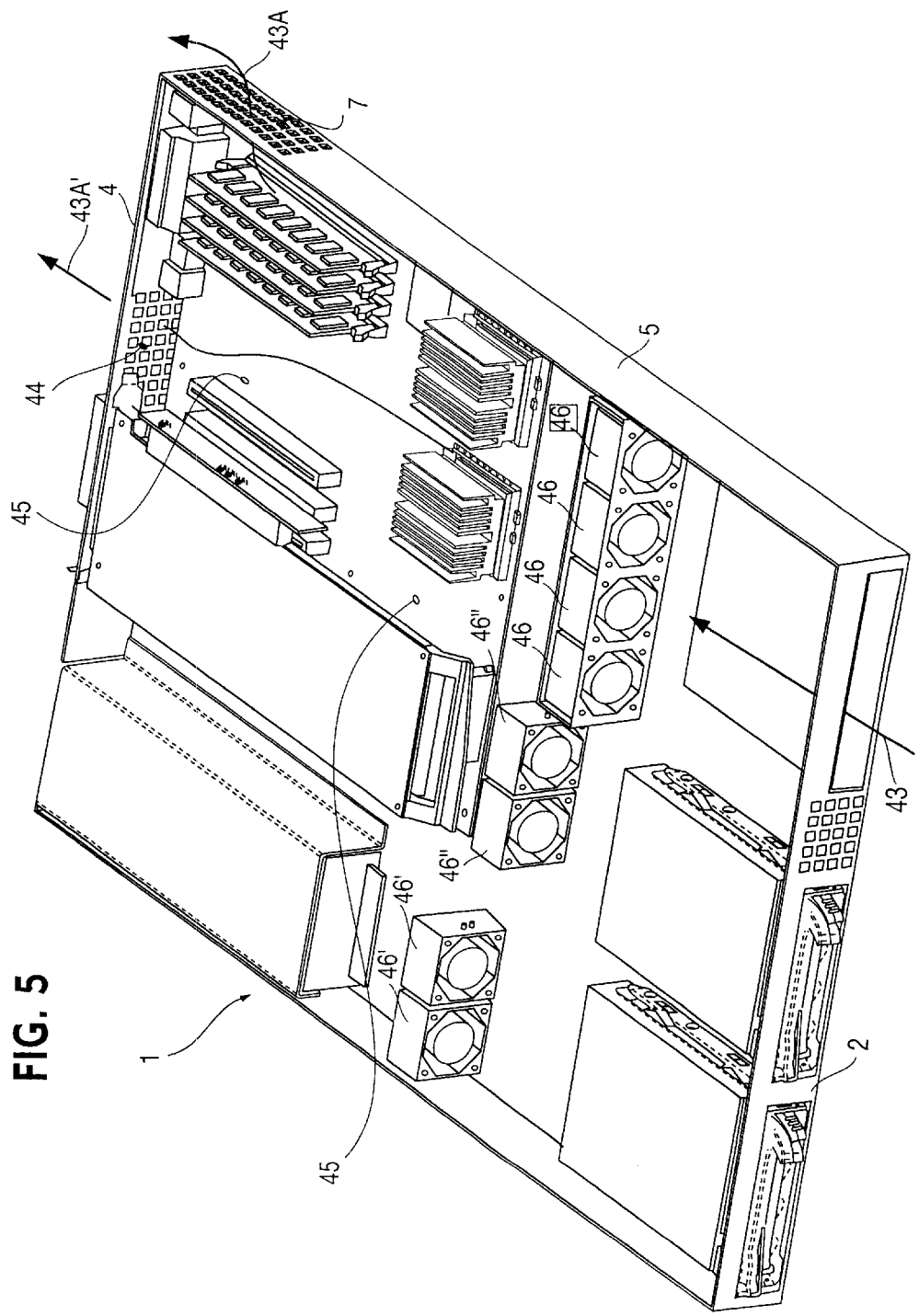
FIG. 5 shows air flow within a thin server according to an example embodiment.

FIG. 5 shows an example embodiment of air flow within thin server 1. Arrow 43 shows air flow into thin server 1; flow is then through, inter alia, internal component area 45 of thin server 1, which has internal components which are to be cooled. Component area 45 includes heat generating components to be cooled, which can include (but are not limited to) baseboard core components including processors, memories, voltage regulation chips and other chips (such as chipsets).

Air is moved through thin server 1 by fans 46, 46' and 46". There are four (4) fans 46, for cooling the core of server 1; two (2) fans 46', for cooling the power supply; and two (2) fans 46", for cooling expansion cards, shown in FIG. 5. The present invention is not limited to the number and types of fans (in general, air moving devices) shown in FIG. 5. As can be seen in FIG. 5, air passes through internal component area 45, and as outlet air flow 43A passes through holes 7, and can then pass, for example, into air channel 14 of spacer rail 3 (shown in FIG. 2), to more efficiently cool internal components 45.

Also shown in FIG. 5 is outlet air flow 43A' directed to rear 4 of thin server 1, and holes 44 in rear 4 for air circulation. As is clear in FIG. 5, the area of rear 4 of thin server 1 available for holes for air circulation is relatively small; however, any problems of back pressure can be avoided according to the present invention, utilizing holes 7 in side 5 of thin server 1, as outlets for warmed air.

Fans 46,46,46,46, draw ambient air from the front of thin server 1, shown by arrow 43, and forces it to flow over core components. Outlet air is forced out of thin server 1 through vents 7 and 44.

The location of fans 46,46,46,46 is dependent on the location of the core components, which may vary from baseboard to baseboard. The position of fans 46,46',46", etc., preferably is such that they draw cool ambient air from the front of the thin server and force the air over the heat generating components. The number of fans 46,46",46", etc., is variable between different thin servers. Fewer fans are desired for acoustical concerns; however, more are desired for cooling concerns. Acoustical and cooling requirements differ between different thin server (e.g., 1U server) designs.

Figure 6:
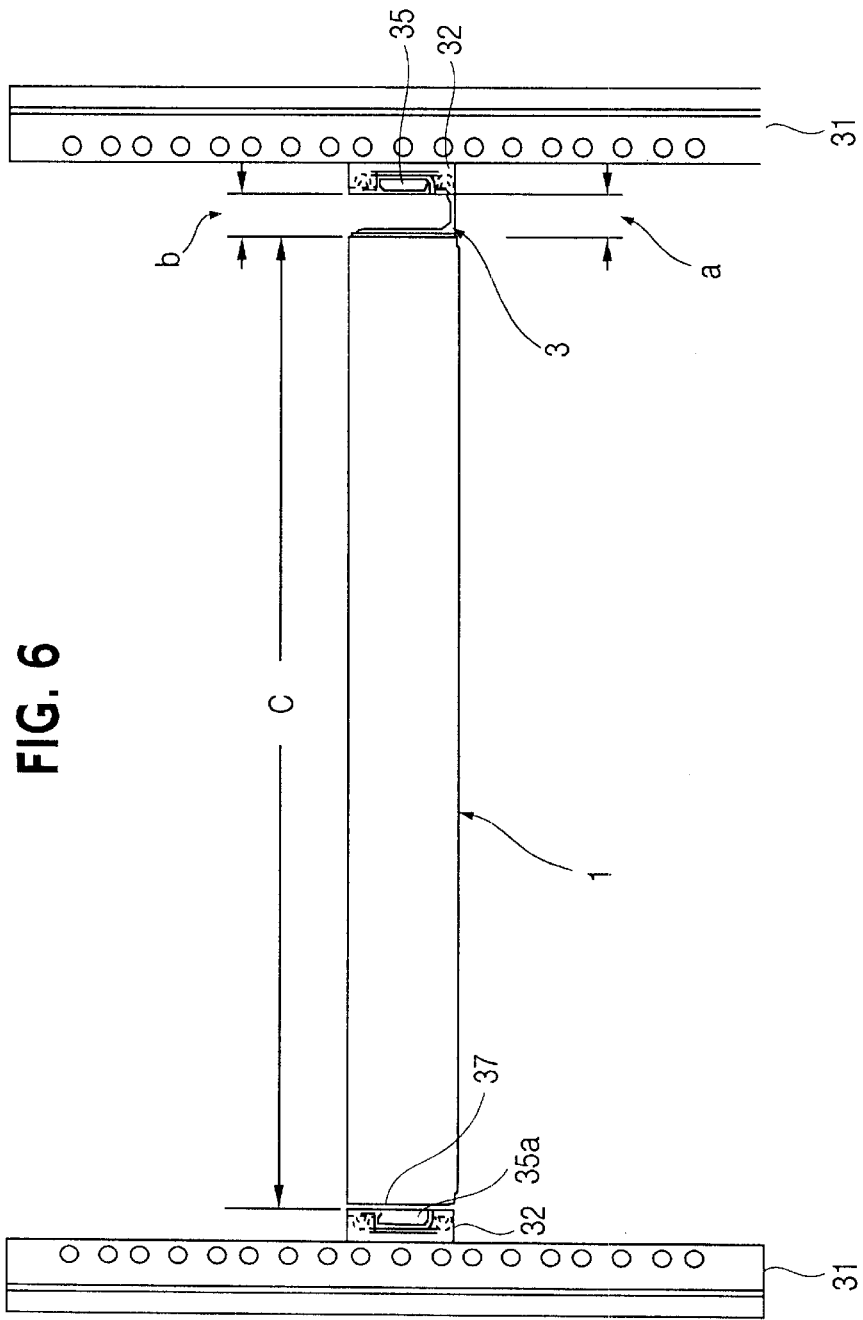
FIG. 6 is a cross-sectional view illustrating positioning of a thin server having a spacer rail attached thereto, mounted on a support, according to an example embodiment.

FIG. 6 shows, in cross-section, thin server 1 mounted on sides of a support. Shown in FIG. 6 is supporting structure 31, 31 at both sides of thin server 1, for example, attached to side 29 of cabinet 25 (not shown) and the side of cabinet 25 opposite side 29. Attached to supporting structure 31 is supporting members 32, which hold attachments 35, 35a respectively attached to spacer rail 3 and the side of thin server 1 opposite side 5 having spacer rail 3 fastened thereto (that is, side 37). Attachments 35, 35a cooperate with supporting members 32, 32 as typical extension slides operate. That is, attachments 35, 35a slide along surfaces of supporting member 32 so as to be inserted, for example, within the support (for example, a cabinet) and supported therein.

As indicated previously, the aforementioned EIA Standard EIA-310-D provides a set size for internal width of, e.g., various types of cabinet for supporting electrical components (including computers, such as thin servers). According to the present invention, the width of thin server 1 is decreased and the decrease in width is made up for by insertion of the spacer rail, providing air channel 14.

For example, and not to be limiting, internal dimensions of spacer rail 3 (distance a in FIG. 6) can be 0.610 inches and outside dimension b of spacer rail 3 can be 0.730 inches). The width c of thin server 1 can be narrowed to 16.02 inches to provide space for spacer rail 3, while maintaining the standard width between sides of the cabinet holding the thin server.

Figure 7:
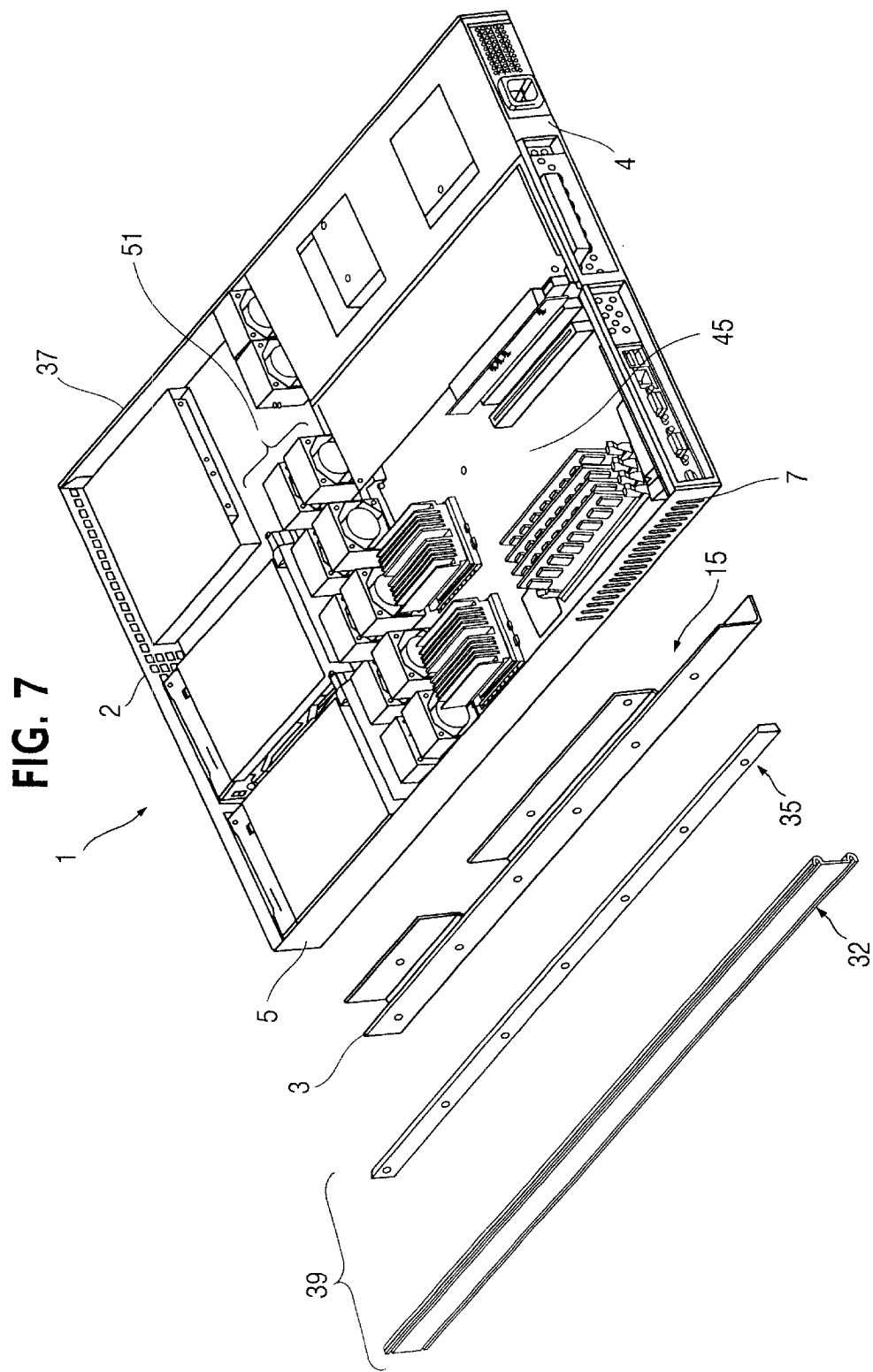
FIG. 7 shows an extension slide assembly for mounting the spacer rail on a support for the thin server, according to an example embodiment.

FIG. 7 shows an exploded perspective view of the extension slide assembly, and thin server and spacer rail structure, according to an example embodiment. Shown in FIG. 7 is thin server 1, having internal component area 45. Also shown in FIG. 7 is a bank 51 of fans, to create air flow through thin server 1. Thin server 1 has front 2 and rear 4, and sides 5 and 37. On side 5 is spacer rail 3, having cut-out portions 15 exposing holes 7 in side 5 of thin server 1. Also shown in FIG. 7 is attachment 35 to be attached to spacer rail 3. Attachment 35 cooperates with supporting member 32 so that thin server 1 can be slid in and out of the support (e.g., a cabinet, not shown in FIG. 7) for supporting thin server 1. Supporting member 32 and attachment 35 cooperate to form extension slide assembly 39. As is clear from FIG. 6, similar structure to attachment 35 (that is, attachment 35a) is provided on side 37 of thin server 1, and a supporting member 32 cooperates therewith in supporting thin server 1. Supporting members 32, 32 can be fastened to the support.

The thin server can be provided with the spacer rail fastened thereto by any appropriate technique. For example, with side 5 of thin server 1 and leg portion 9 of spacer rail 3 having corresponding screw holes, screws can be used to fasten spacer rail 3 to side 5 of thin server 1. Alternatively, side 5 of thin server 1 can have slots, with leg portion 9 of spacer rail 3 having complementary structure to fasten spacer rail 3 on side 5. As can be appreciated, spacer rail 3 can be removably fastened on side 5; however, it is also within the contemplation of the present invention that spacer rail 3 is permanently fastened on side 5, including being integrally formed with side 5.

Thin server 1, with spacer rail 3 fastened thereto, can be mounted on a support (for example, mounted in a cabinet) by any appropriate technique. For example, side 37 and leg portion 11 of spacer rail 3 can be provided with attachments 35a, 35, respectively and slid into supporting member 32, 32, this technique operating as a known extension slide assembly similar to the conventional technique used with slides for, e.g., kitchen drawers. Alternatively, leg portion 11 of spacer rail 4 and side 37 of thin server 1, on the one hand, and side panels of cabinet 25, on the other, can be provided with corresponding screw holes, with screws then being used to fasten thin server 1 to cabinet 25 through these screw holes. Thin server 1 is removably fastened to its support (e.g., to cabinet 25).

Through application of the present invention, having holes in a side of the thin server and having the spacer rail, e.g., providing an air flow channel, chassis side venting can be achieved; moreover, the spacer rail also provides reinforcement to the computer mounting scheme. The present invention is particularly applicable to thin servers which are only 1.75 inches tall, the spacer rail leaving exposed vent holes in the side of this thin server, and providing an air channel for efficient removal of warmed air from the thin server.

Many different embodiments of the present invention may be constructed without departing from the spirit and scope of the invention. For example, it is desirable to make a common spacer rail which can be used for multiple designs of computer. Common mounting holes/techniques can be used on sides of different computers (e.g., different servers), so that a same spacer rail design (e.g., same spacer rail) can be used on the different computers. Moreover, it is desirable to limit area of the spacer rail leg portion adjacent the computer side having the vent holes, so that a common spacer rail can be used with various designs for the computers (having different numbers of side vent holes and/or different configurations for the side vent holes and hole array), while maintaining enough area of this spacer rail leg portion adjacent the computer side having the vent holes, to provide reinforcement and structural stability. It should be understood that the present invention is not limited to the specific embodiments described in this specification. To the contrary, the present invention is intended to cover various modifications and equivalent arrangements included within the spirit and scope of the claims.

What is claimed is:

1. Chassis structure of a computer, comprising:
   a computer chassis, having a front and back and opposed sides, at least the front, back and one side, of the opposed sides, of the computer chassis having holes therethrough for circulation of air through the computer chassis;
   at least one air moving device in the computer chassis, provided to force flow of air through the computer chassis, and adapted to draw air into the computer chassis through the holes in the front of the computer chassis and cause air to flow out of the computer chassis through the holes in the one side and the back of the computer chassis; and
   a spacer rail extending along the one side of the computer chassis having the holes, and fastened to the one side, said spacer rail when fastened to the one side leaving the holes in the one side exposed, the spacer rail providing a space for air flow along the one side of the computer chassis having the holes therethrough.

2. Chassis structure according to claim 1, wherein the spacer rail is U-shaped in cross-section.

3. Chassis structure according to claim 1, wherein said one side of the computer chassis has a front portion closest to the computer chassis front and a rear portion closest to the computer chassis back, the front and rear portions meeting at a mid-point of the one side of the computer chassis, and wherein more than one-half of the area of the holes, for circulation of air, through the one side of the computer chassis, is in said rear portion.

4. Chassis structure according to claim 1, wherein all of the holes, for circulation of air through the computer chassis, in the one side of the computer chassis, are in the 25% of the one side closest to the back of the computer chassis.

5. Chassis structure according to claim 4, wherein the sum of the area of the holes in the back and the one side of the computer chassis exceeds the area of the holes in the front of the computer chassis.

6. Chassis structure according to claim 4, wherein the holes in the one side of the computer chassis constitute at least 5% by area of the entire area of the one side of the computer chassis.

7. Chassis structure according to claim 1, wherein said computer chassis is a computer chassis of a thin server, having a height of at most 2U, U being equal to 1.75 inches.

8. Chassis structure according to claim 7, wherein the thin server has a height of 1U.

9. A computer, comprising:
   a computer chassis, having opposed front and back, and opposed sides, at least the front, back and one side, of the opposed sides, of the computer chassis having holes therethrough, the holes in each of the front, back and one side being adapted for flow of air through the holes, for circulation of air through the computer chassis; and
   at least one air moving device in the computer chassis, provided to force flow of air through the computer chassis, and adapted to draw air into the computer chassis through the holes in the front of the computer chassis and cause air to flow out of the computer chassis through the holes in the one side and the back of the computer chassis,
   wherein more than one-half of the area of the holes in the one side of the computer chassis, for circulation of air through the computer chassis, is in one-half the area of the one side of the computer chassis which is closest to the back of the computer chassis.

10. The computer according to claim 9, wherein the computer further comprises internal components which product heat, said internal components being located within the computer chassis; and wherein said internal components, said holes in the one side of the computer chassis, and said at least one air moving device, are provided to draw air into the computer through the holes in the front of the computer chassis and pass the air by said internal components which produce heat, prior to the air flowing out of the computer chassis through the holes in the one side and the back of the computer chassis.

11. The computer according to claims 9, wherein the computer includes baseboard core components, and the one side of the computer chassis having the holes therethrough is the side of the computer chassis closest to said baseboard core components.

12. The computer according to claim 11, wherein said baseboard core components include processors, memory, voltage regulation chips and chipsets of said computer.

13. The computer according to claim 9, further comprising a spacer rail fastened to the one side of the computer chassis, wherein the spacer rail has first and second portions spaced from each other in a direction perpendicular to the one side of the computer chassis, the first portion being adjacent the one side of the computer chassis, and wherein the first portion exposes the holes in the one side of the computer chassis.

14. The computer according to claim 13, wherein the spacer rail is removably fastened to the computer chassis.

15. The computer according to claim 9, wherein said computer is a thin server, having a height of at most 2U, U being equal to 1.75 inches.

16. The computer according to claim 15, wherein the thin server has a height of 1U.

17. At least one computer mounted on a support, comprising:
- a support, capable of mounting a plurality of computers with each computer positioned above an adjacent computer, the support having fasteners for holding each computer across a width of the support;
- a least one computer mounted on the support, wherein the at least one computer has a computer chassis having a front exposed at a front of the support, a back opposite the front, and two opposed sides extending between the front and back, at least the front, back and one side, of the two opposed sides, having holes extending therethrough, the holes being adapted for flow of air through the holes, for circulation of air through the computer chassis;
- at least one air moving device in the computer chassis, provided to force flow of air through the computer chassis, and adapted to draw air into the computer chassis through the holes in the front of the computer chassis and cause air to flow out of the computer chassis through the holes in the one side and the back of the computer chassis; and
- a spacer rail extending along said one side of the computer chassis, fastened to the one side of the computer chassis, the spacer rail providing a space for air flow along the one side of the computer chassis having the holes therethrough,
- wherein the spacer rail and the front of the computer chassis in total extend substantially across the width of the support, and
- wherein the opposed side of the computer chassis to the one side, and the spacer rail, are fastened to the support to mount the computer on the support.

18. At least one computer mounted on the support according to claim 17, wherein the spacer rail is removably fastened to at least one of said one side of the computer chassis and to said support.

19. At least one computer mounted on the support according to claim 17, wherein said spacer rail includes first and second leg portions spaced from each other in a direction perpendicular to the one side of the computer chassis, and a third portion extending between the first and second leg portions, and wherein said first leg portion is fastened to said one side of the computer chassis and the second leg portion is fastened to the support.

20. At least one computer mounted on the support according to claim 19, wherein the first leg portion has openings which expose said holes in the one side of the computer chassis.

21. At least one computer mounted on the support according to claim 17, wherein said support is a cabinet, wherein the cabinet has a security door which is adapted to lock the at least one computer in the cabinet, and wherein the security door has an opening exposing the front of the computer chassis of the at least one computer.

22. At least one computer mounted on the support according to claim 21, wherein said cabinet has an air moving device on the top thereof.

23. At least one computer mounted on the support according to claim 17, wherein a plurality of the at least one computer are mounted on the support, with each computer above an adjacent lower computer.

24. At least one computer mounted on a support according to claim 17, wherein each of the at least one computer is a thin server, and has a height of at most 2U, U being 1.75 inches.

25. At least one computer mounted on a support according to claim 17, wherein the support includes support members and an extension slide assembly which can be extended out from the support members, and wherein the opposed side of the computer chassis and the spacer rail are fastened to the extension slide assembly.

26. A method for mounting at least one computer on a support, comprising:
- providing at least one computer according to claim 13,
- fastening the spacer rail to the support at one portion of the support; and
- fastening the opposed side of the computer chassis, which is the side other than said one side, to another portion of the support.

27. A method for mounting at least one computer on a support, comprising:
- providing at least one computer according to claim 8;
- fastening a spacer rail to said one side of the computer chassis, such that the holes in said one side of the computer chassis are exposed;
- fastening the spacer rail to the support at one portion of the support; and
- fastening the opposed side of the computer chassis, which is the side other than said one side, to another portion of the support.

28. Chassis structure of a computer, comprising:
- a computer chassis, having a front and back and opposed sides, at least the front and one side, of the opposed sides, of the computer chassis having holes therethrough for circulation of air through the computer chassis; and
- a spacer rail extending along the one side of the computer chassis having the holes, and fastened to the one side, said spacer rail when fastened to the one side leaving the holes in the one side exposed, the spacer rail providing a space for air flow along the one side of the computer chassis having the holes therethrough, the spacer rail including a channel providing said space for air flow.

29. A computer, comprising:
- a computer chassis, having opposed front and back, and opposed sides, at least both the front and one side, of the opposed sides, of the computer chassis having holes therethrough, the holes being adapted for flow of air through the holes, for circulation of air through the computer chassis;
- a spacer rail fastened to the one side of the computer chassis, wherein the spacer rail has first and second portions spaced from each other in a direction perpendicular to the one side of the computer chassis, the first portion being adjacent the one side of the computer chassis, and wherein the first portion exposes the holes in the one side of the computer chassis; and at least one air moving device in the computer chassis, provided to force flow of air through the computer chassis, and adapted to draw air into the computer chassis through the holes in the front of the computer chassis and cause air to flow out of the computer through the holes in the one side of the computer chassis, wherein more than one-half of the area of the holes in the one side of the computer chassis, for circulation of air through the computer chassis, is in one-half the area of the one side of the computer chassis which is closest to the back of the computer chassis, and wherein the first and second portions of the spacer rail form a space therebetween that is a channel for flow of air along the one side of the computer chassis having the holes therethrough.

30. At least one computer mounted on a support, comprising:

a support, capable of mounting a plurality of computers with each computer positioned above an adjacent computer, the support having fasteners for holding each computer across a width of the support;

at least one computer mounted on the support, wherein the at least one computer has a computer chassis having a front exposed at a front of the support, a back opposite the front, and two opposed sides extending between the front and back, at least both the front and one side, of the two opposed sides, having holes extending therethrough, the holes being adapted for flow of air through the holes, for circulation of air through the computer chassis; and a spacer rail extending along said one side of the computer chassis, fastened to the one side of the computer chassis, the spacer rail providing a space for air flow along the one side of the computer chassis having the holes therethrough, wherein the spacer rail includes a channel providing said space for air flow, wherein the spacer rail and the front of the computer chassis in total extend substantially across the width of the support, and wherein the opposed side of the computer chassis to the one side, and the spacer rail, are fastened to the support to mount the computer on the support.

* * * * *

UNITED STATES PATENT AND TRADEMARK OFFICE
CERTIFICATE OF CORRECTION

PATENT NO. : 6,574,100 B1  Page 1 of 1
DATED : June 3, 2003
INVENTOR(S) : Paul H. Anderson It is certified that error appears in the above-identified patent and that said Letters Patent is hereby corrected as shown below:

<u>Column 8,</u>
Line 54, "product heat" should be -- produce heat --;
Line 63, "claims 9," should be -- claim 9, --;

<u>Column 10,</u>
Line 55, "claim 8" should be -- claim 9 --.

Signed and Sealed this

Fourth Day of April, 2006

JON W. DUDAS
*Director of the United States Patent and Trademark Office*